United States Patent
Chen et al.

(10) Patent No.: US 7,791,429 B2
(45) Date of Patent: Sep. 7, 2010

(54) EQUALIZER AND CONNECTOR INCLUDING THE SAME

(75) Inventors: Chun-Jen Chen, Taipei Hsien (TW); Shou-Kuo Hsu, Taipei Hsien (TW)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 170 days.

(21) Appl. No.: 12/168,541

(22) Filed: Jul. 7, 2008

(65) Prior Publication Data

US 2009/0278633 A1    Nov. 12, 2009

(30) Foreign Application Priority Data

May 9, 2008    (CN)    ............ 2008 1 0301500

(51) Int. Cl.
*H03H 7/03* (2006.01)
*H04B 3/04* (2006.01)

(52) U.S. Cl. .................................... 333/28 R

(58) Field of Classification Search ............... 333/28 R, 333/18
See application file for complete search history.

(56) References Cited

U.S. PATENT DOCUMENTS

| 4,122,417 | A  | * | 10/1978 | Takasaki et al. | ............ | 333/28 R |
| 5,717,405 | A  | * | 2/1998  | Quan            | ............ | 342/373  |
| 6,107,896 | A  | * | 8/2000  | Elco et al.     | ............ | 333/28 R |
| 6,646,519 | B2 | * | 11/2003 | Sperber         | ............ | 333/28 R |
| 2007/0030092 | A1 | * | 2/2007 | Yeung et al.    | ............ | 333/28 R |

* cited by examiner

*Primary Examiner*—Stephen E Jones
(74) *Attorney, Agent, or Firm*—D. Austin Bonderer

(57) ABSTRACT

An equalizer includes a first resistor and a capacitor connected in parallel. The positive terminal of the capacitor is connected to a signal transmission line on a blah printed circuit board. The negative terminal of the capacitor is connected to ground through a second resistor. A connector including the equalizer and a printed circuit board including the connector are also provided.

9 Claims, 7 Drawing Sheets

EQUALIZER AND CONNECTOR INCLUDING THE SAME

BACKGROUND

1. Field of the Invention

The present invention relates to an equalizer, a connector including the equalizer, and a printed circuit board including the connector.

2. Description of Related Art

With the ever increasing speeds of signals in printed circuit board transmission lines, high frequency loss of the signals becomes greater. Pre-emphasis and de-emphasis are two popular ways to compensate for the high frequency loss in the signal transmission lines. Pre-emphasis improves performance of the signal transmission lines through increasing the magnitude of the high frequency signals, and de-emphasis improves the performance of the signal transmission lines through reducing the magnitude of low frequency signals. However, both pre-emphasis and de-emphasis consume power, and emit electro-magnetic radiation.

What is needed, therefore, is a device which can compensate for high frequency loss in signal transmission lines while consuming little power.

DETAILED DESCRIPTION

Figure 1:
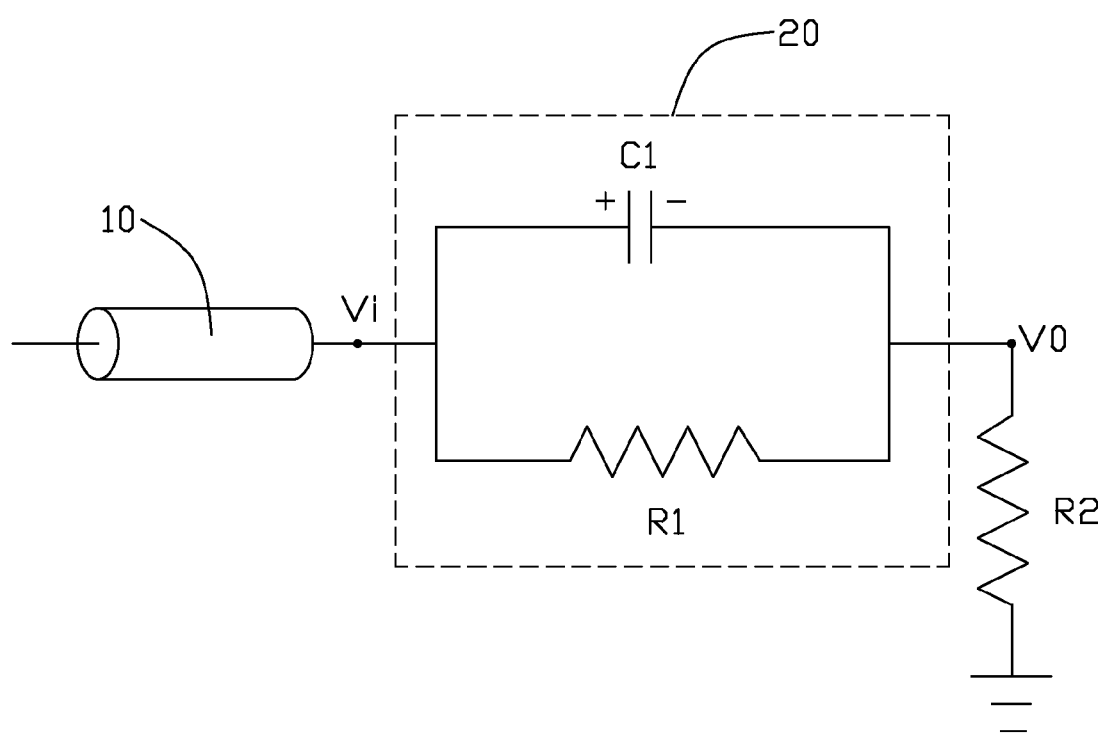
FIG. 1 is a circuit diagram of an equalizer in accordance with an embodiment of the present invention.

Referring to FIG. 1, an equalizer 20 in accordance with an embodiment of the present invention includes a resistor R1 and a capacitor C1 connected in parallel. In use, a positive terminal of the capacitor C1 is connected to a signal transmission line 10 on a printed circuit board (PCB) and acts as the input of the equalizer 20. A negative terminal of the capacitor C1 is connected to ground through a resistor R2 and acts as the output of the equalizer 20 respectively. Voltage at the input is denoted as Vi, and voltage at the output is denoted as Vo. Thus, the frequency response H of the equalizer 20 is found using the following equation:

$$H(s) = \frac{V_o(s)}{V_i(s)} = \frac{s*C1*R1*R2 + R2}{s*C1*R1*R2 + R2 + R1} \quad (1)$$

wherein s is complex frequency jw. It can be seen from the equation (1) that $1/(R1*C1)$ is a zero of the response and $(R2+R1)/(C1*R1*R2)$ is a pole of the response. Thus, to obtain a given low frequency gain A dB, and if the resistance of the resistor R2 is known, the resistance of the resistor R1 is calculated as follows:

$$R1 = \frac{R2*(1 - 10^{A/20})}{10^{A/20}} \quad (2)$$

Suppose the main frequency of a signal transmitting through the signal transmission line 10 is F Hz, the pole $(R2+R1)/(C1*R1*R2)$ should be lower than F Hz. Thus, the capacitance of the capacitor C1 is calculated as follows:

$$C1 \geq \frac{R1 + R2}{2\pi F R1 R2} \quad (3)$$

With the capacitance of the capacitor C1 becoming larger, a frequency scope of the low frequency gain of the equalizer 20 will be more narrow. Thus, although the capacitance of the capacitor C1 only has a lower limit value according to the equation (3), the capacitance of the capacitor C1 should not be too large. In other embodiments, the resistor R1 can be a variable resistor, and the capacitor C1 can be a variable capacitor.

For the equalizer 20 with −9.5 dB low frequency gain, suppose that the transmission rate and the main frequency of the signal transmitting through the signal transmission line 10 are 5 Gbps and 2.5 GHz respectively, the resistance of the resistor R1 and the capacitance of the capacitor C1 is calculated as follows:

$$\begin{cases} R1 = 100\Omega \\ C1 \geq 2\,\text{pF} \end{cases} \quad (4)$$

Figure 2:
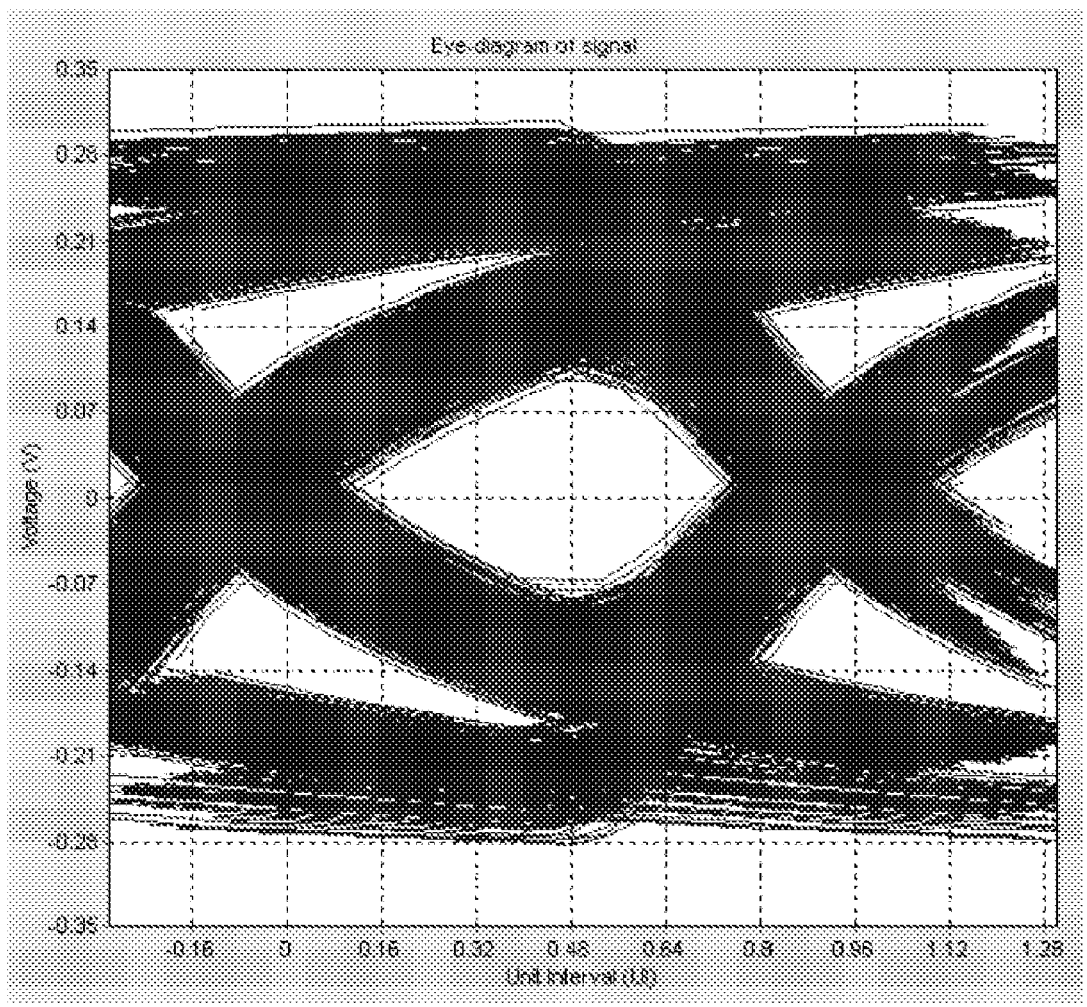
FIG. 2 is an eye diagram of a signal transmitting through a transmission line on a print circuit board (PCB) without the equalizer.
Figure 3:
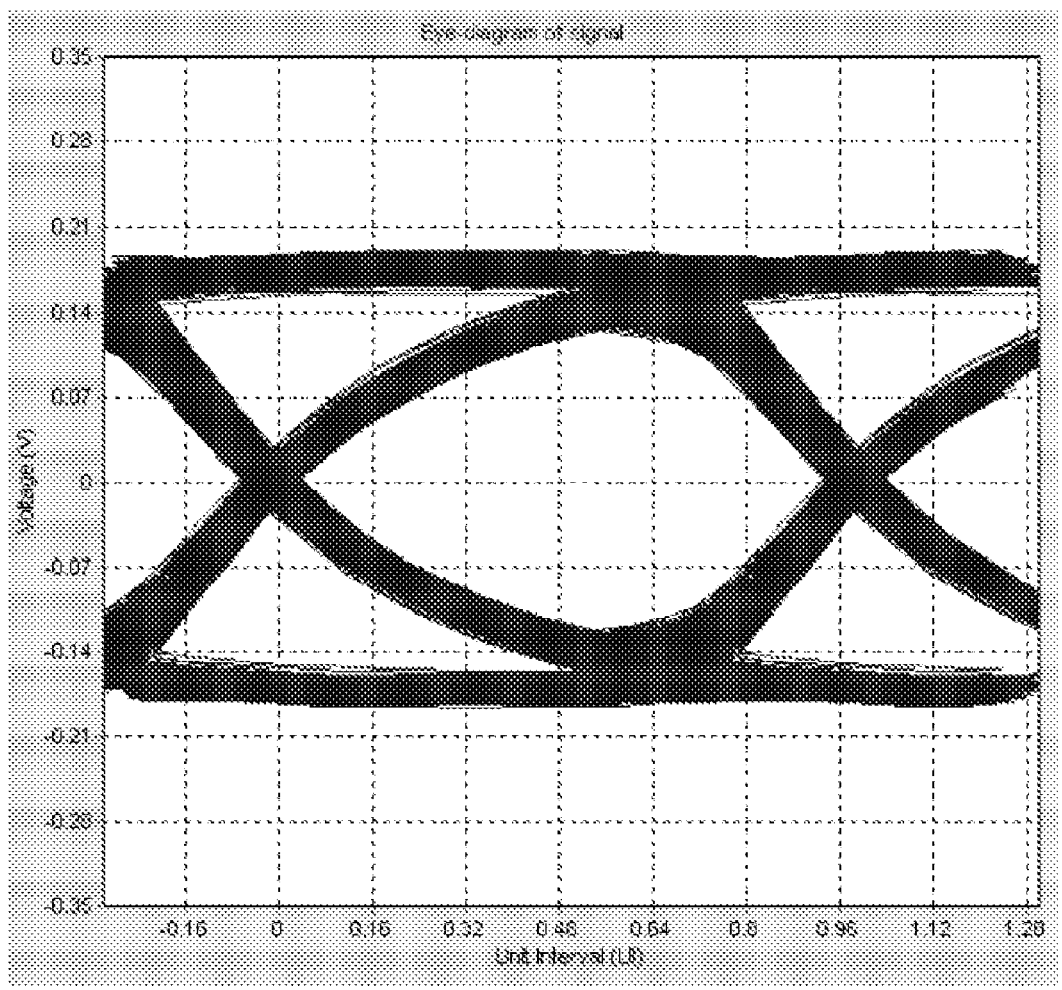
FIG. 3 is an eye diagram of a signal transmitting through a transmission line on a PCB including the equalizer of FIG. 1.
Figure 4:
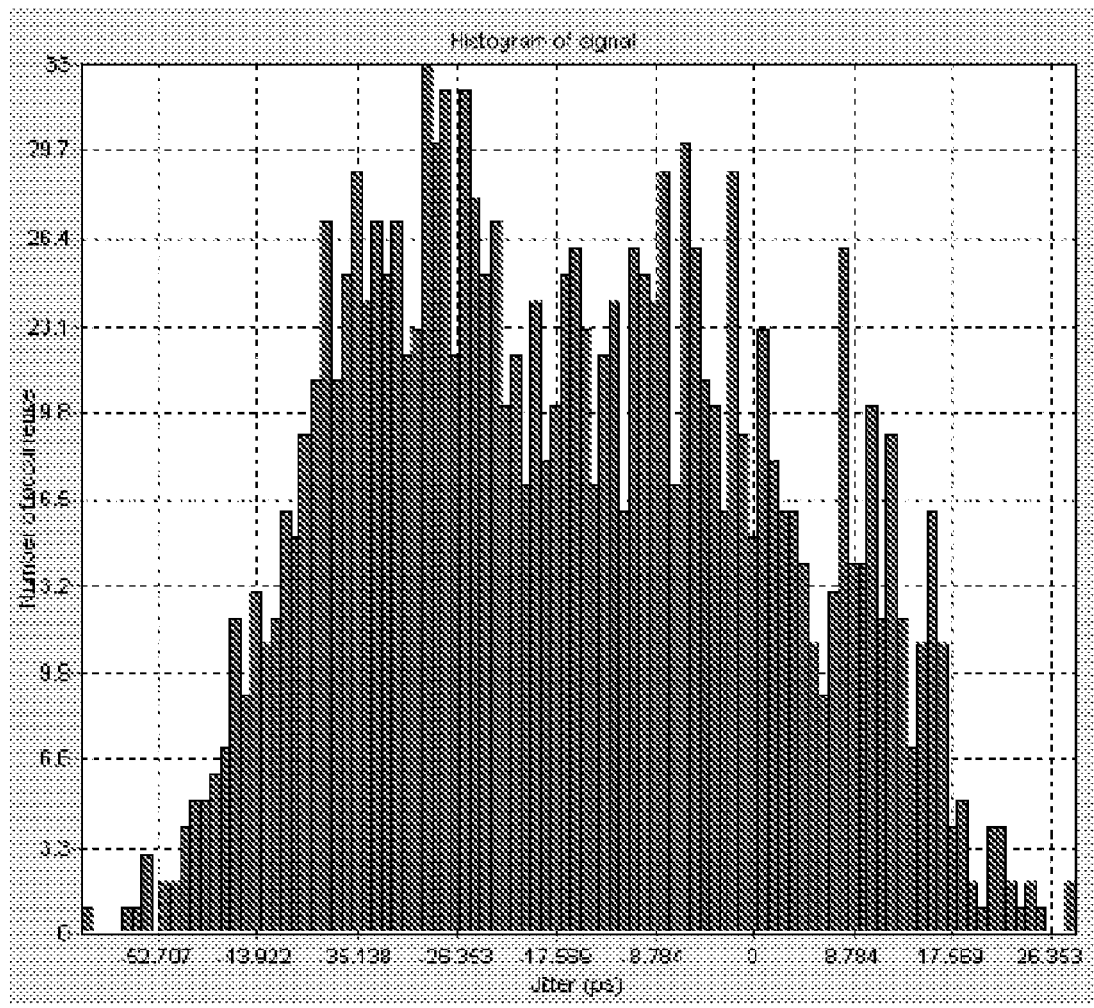
FIG. 4 is a histogram of a signal transmitting through the transmission line on the PCB without the equalizer.
Figure 5:
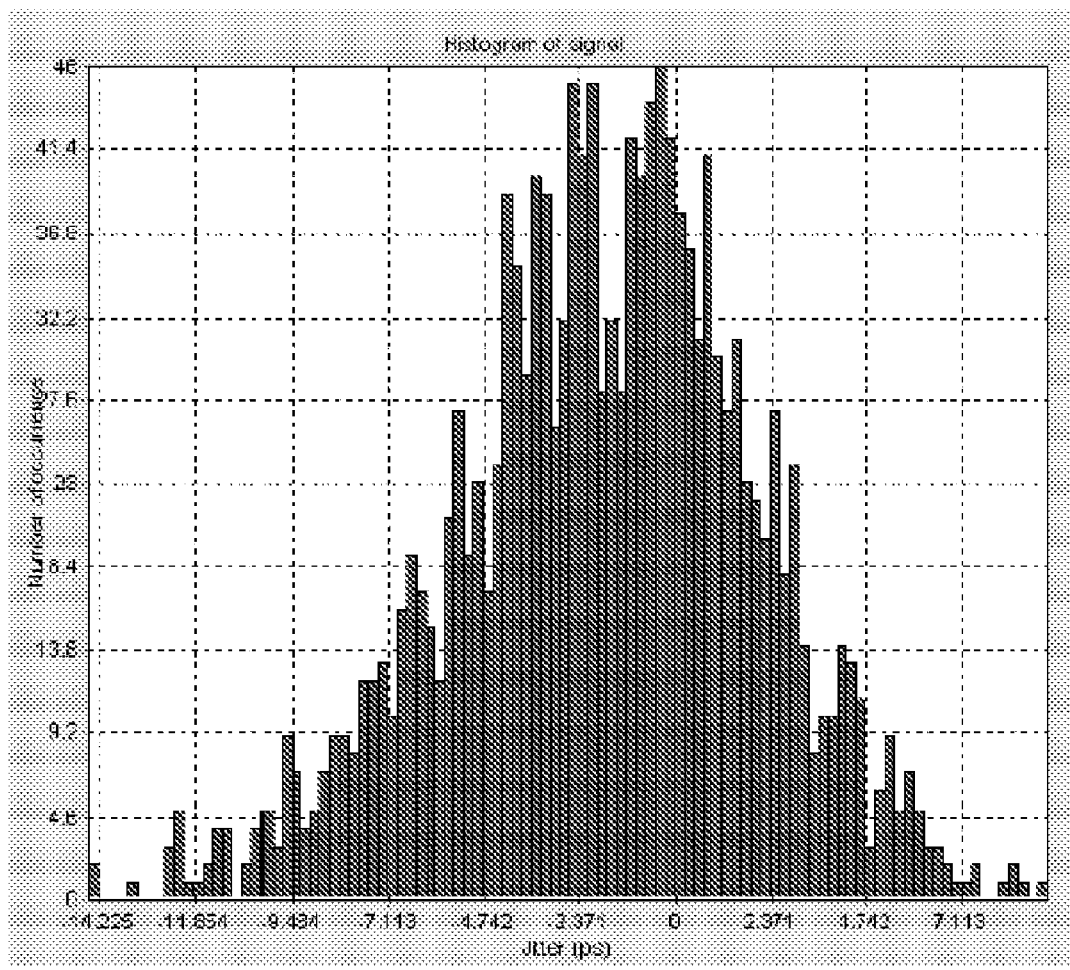
FIG. 5 is a histogram of a signal transmitting through the transmission line on the PCB including the equalizer of FIG. 1.

The capacitance of the capacitor C1 is 5 pF in this embodiment. In contrast to FIG. 2, owing to the equalizer 20 connected at the reception terminal of the signal transmission line 10, jitter and eye height of the signal transmitting through the signal transmission line 10 in FIG. 3 are improved. The equalizer 20 not only has simple structure with low power consumption but also improves the performance of the signal transmission line 10. In addition, the jitter signals in FIG. 5 are much less than those in FIG. 4.

Figure 6:
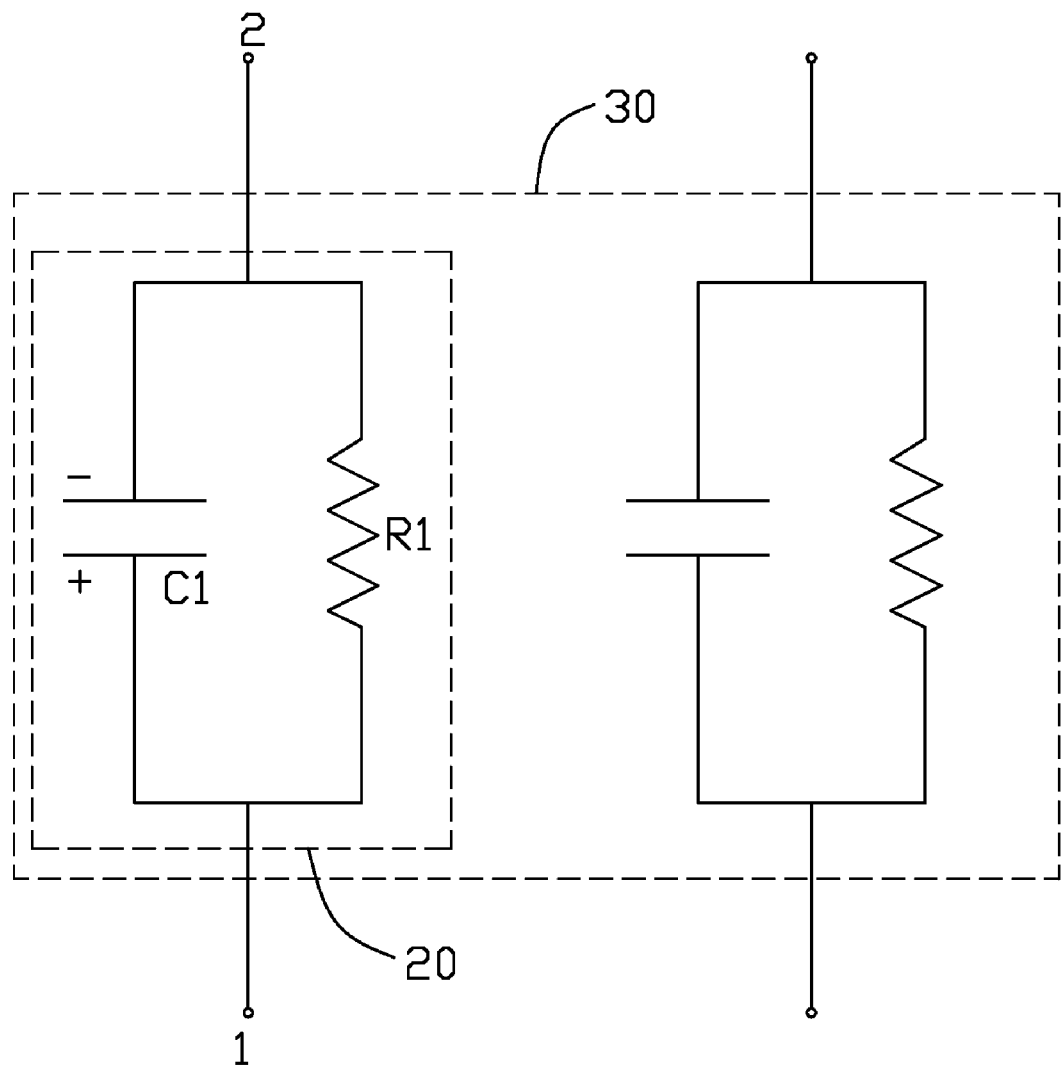
FIG. 6 is a schematic view of a connector including the equalizer of FIG. 1.

Referring to FIG. 6, a connector 30 in accordance with an embodiment of the present invention includes a plurality of equalizers 20, pins 1, and pins 2. In each equalizer 20, the positive terminal of the capacitor C1 is connected to a mother board through the pin 1, and the negative terminal of the capacitor C1 is connected to an external card through the pin 2. The resistor R1 is connected in parallel with the capacitor C1 in each equalizer 20. The resistor R1 can be a variable resistor, and the capacitor C1 can be a variable capacitor. The connector 30 also can be used to connect two other different electronic devices. The number of the equalizers 20 in the connector 30 can be altered according to the number of the pins of the connector 30.

Figure 7:
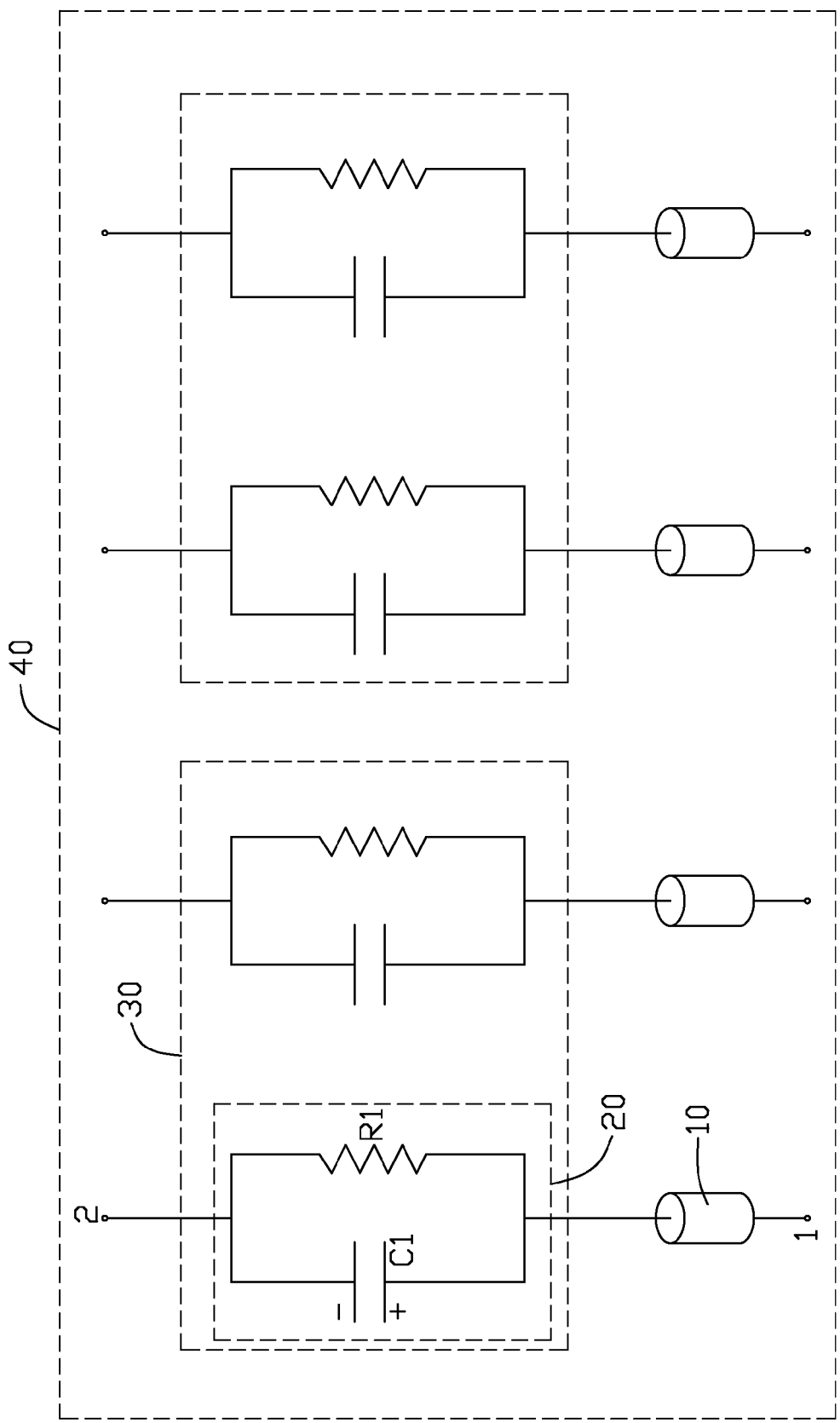
FIG. 7 is a schematic view of a PCB including the connector of FIG. 6.

Referring to FIG. 7, a PCB 40 in accordance with an embodiment of the present invention includes a plurality of connectors 30 and transmission lines 10. Each connector 30 includes a plurality of equalizers 20, pins 1, and pins 2. In each equalizer 20, the positive terminal of the capacitor C1 is connected to a mother board through the transmission line 10 and the pin 1, and the negative terminal of the capacitor C1 is connected to an external card through the pin 2. The resistor R1 is connected in parallel with the capacitor C1 in each equalizer 20. The resistor R1 can be a variable resistor, and the capacitor C1 can be a variable capacitor. The connector 30 also can be used to connect two other different electronic devices. The number of the equalizers 20 in the connector 30 can be altered according to the number of the pins of the connector 30. The number of the connector 30 in the PCB 40 can be altered.

The foregoing description of the exemplary embodiments of the invention has been presented only for the purposes of illustration and description and is not intended to be exhaustive or to limit the invention to the precise forms disclosed. Many modifications and variations are possible in light of the above everything. The embodiments were chosen and described in order to explain the principles of the invention and their practical application so as to enable others skilled in the art to utilize the invention and various embodiments and with various modifications as are suited to the particular use contemplated. Alternately embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. An equalizer using in a signal transmission line, the equalizer comprising:
   a first resistor;
   a capacitor comprising a positive terminal connected to the signal transmission line on a printed circuit board, and a negative terminal connected to ground through the first resistor; and
   a second resistor connected in parallel with the capacitor;
   wherein a resistance R1 of the first resistor is calculated as follows:

$$R1 = \frac{R2 * (1 - 10^{A/20})}{10^{A/20}},$$

A is a given low frequency gain, R2 is a resistance of the second resistor; and
   a capacitance C1 of the capacitor is calculated as follows:

$$C1 \geq \frac{R1 + R2}{2\pi FR1R2},$$

F is a main frequency of a signal transmitting through the signal transmission line.

2. The equalizer as claimed in claim 1, wherein the capacitor is a variable capacitor.

3. The equalizer as claimed in claim 1, wherein the second resistor is a variable resistor.

4. A connector, comprising:
   one or more equalizers each used in a corresponding signal transmission line, each equalizer comprising:
      a first resistor;
      a capacitor comprising a positive terminal connected to the corresponding signal transmission line on a printed circuit board, and a negative terminal connected to ground through the first resistor; and
      a second resistor connected in parallel with the capacitor;
   wherein a resistance R1 of the first resistor is calculated as follows:

$$R1 = \frac{R2 * (1 - 10^{A/20})}{10^{A/20}},$$

A is a given low frequency gain, R2 is a resistance of the second resistor; and
   a capacitance C1 of the capacitor is calculated as follows:

$$C1 \geq \frac{R1 + R2}{2\pi FR1R2},$$

F is a main frequency of a signal transmitting through the signal transmission line.

5. The connector as claimed in claim 4, wherein the capacitor is a variable capacitor.

6. The connector as claimed in claim 4, wherein the second resistor is a variable resistor.

7. A printed circuit board, comprising:
   a plurality of transmission lines;
   a connector comprising:
      one or more equalizers each corresponding to one of the plurality of transmission lines, each equalizer comprising:
         a first resistor;
         a capacitor comprising a positive terminal connected to the corresponding signal transmission line, and a negative terminal connected to ground through the first resistor; and
         a second resistor connected in parallel with the capacitor;
      wherein a resistance R1 of the first resistor is calculated as follows:

$$R1 = \frac{R2 * (1 - 10^{A/20})}{10^{A/20}},$$

A is a given low frequency gain, R2 is a resistance of the second resistor; and
   a capacitance C1 of the capacitor is calculated as follows:

$$C1 \geq \frac{R1 + R2}{2\pi FR1R2},$$

F is a main frequency of a signal transmitting through one of the plurality of signal transmission lines.

8. The printed circuit board as claimed in claim 7, wherein the capacitor is a variable capacitor.

9. The printed circuit board as claimed in claim 7, wherein the second resistor is a variable resistor.

* * * * *